United States Patent
Huebel et al.

(10) Patent No.: US 9,857,269 B2
(45) Date of Patent: Jan. 2, 2018

(54) TESTING DEVICE FOR AN EUV OPTICAL SYSTEM

(71) Applicant: Carl Zeiss SMT GmbH, Oberkochen (DE)

(72) Inventors: Alexander Huebel, Aalen (DE); Thomas Niederhausen, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/179,252

(22) Filed: Jun. 10, 2016

(65) Prior Publication Data
US 2016/0282221 A1 Sep. 29, 2016

Related U.S. Application Data

(63) Continuation of application No. PCT/EP2014/077154, filed on Dec. 10, 2014.

(30) Foreign Application Priority Data

Dec. 10, 2013 (DE) .................. 10 2013 225 498

(51) Int. Cl.
*G01J 1/42* (2006.01)
*G01M 11/02* (2006.01)
*G01M 11/00* (2006.01)
*G03F 7/20* (2006.01)
*H05G 2/00* (2006.01)
*G21K 1/06* (2006.01)

(52) U.S. Cl.
CPC ...... *G01M 11/0292* (2013.01); *G01M 11/005* (2013.01); *G03F 7/7085* (2013.01); *G03F 7/70316* (2013.01); *G03F 7/70591* (2013.01); *H05G 2/003* (2013.01); *G21K 1/062* (2013.01)

(58) Field of Classification Search
CPC .............................. G03F 7/70033; H05H 1/24
See application file for complete search history.

(56) References Cited

U.S. PATENT DOCUMENTS

| | | | |
|---|---|---|---|
| 8,149,387 B2 * | 4/2012 | Alberti | G03F 7/70633 355/72 |
| 2006/0091328 A1 | 5/2006 | Kanazawa | |
| 2006/0231731 A1 | 10/2006 | Lauer et al. | |

(Continued)

FOREIGN PATENT DOCUMENTS

| | | |
|---|---|---|
| DE | 102010038697 A1 | 2/2012 |
| EP | 2720014 A1 | 4/2014 |
| JP | 10019763 A * | 1/1998 |

OTHER PUBLICATIONS

Fiedorowicz et al., "Enhanced x-ray emission in the 1-keV range from a laser-irradiated gas puff target produced using the double-nozzle setup," 2000, Appliied Physics B Lasers and Optics, vol. 70, pp. 305-308.*

(Continued)

*Primary Examiner* — Kiho Kim
(74) *Attorney, Agent, or Firm* — Edell, Shapiro & Finnan, LLC

(57) ABSTRACT

A testing device (100) for an EUV optical system (200) includes a generating device (10) configured to generate wavelength variable test spectra for the EUV optical system (200) and a sensor unit configured to detect the test spectra generated by the EUV optical system (200).

15 Claims, 17 Drawing Sheets

(56) References Cited

U.S. PATENT DOCUMENTS

2009/0316746 A1* 12/2009 Nowak ............... G03F 7/70025
372/55
2010/0140512 A1   6/2010 Suganuma et al.
2013/0148105 A1   6/2013 Goeppert

OTHER PUBLICATIONS

International Search Report and Written Opinion in counterpart International Application No. PCT/EP2014/077154, dated Jul. 3, 2015.
Rakowski R. et al., "Metrology of Mo/Si multilayer mirrors at 13 5nm . . . ", Optica Applicata, vol. 36, No. 4, Jan. 2006, p. 593-600, XP055176569.
Wachulak, P. et al., "A 50nm spatial resolution EUV imaging-resolution dependence on object thickness . . . ", Optics Express, vol. 19, No. 10, May 2011, p. 9541-9549.
Parra, E et al., "Laser heating of noble gas droplet sprays: EUV source . . . ", Institute for Physical Science and Technology, University of Maryland, 2002.

* cited by examiner

US 9,857,269 B2

TESTING DEVICE FOR AN EUV OPTICAL SYSTEM

CROSS REFERENCE TO RELATED APPLICATIONS

This is a Continuation of International Application PCT/EP2014/077154, which has an international filing date of Dec. 10, 2014, and the disclosure of which is incorporated in its entirety into the present Continuation by reference. The following disclosure is also based on and claims the benefit of and priority under 35 U.S.C. §119(a) to German Patent Application No. DE 10 2013 225 498.9, filed Dec. 10, 2013, which is also incorporated in its entirety into the present Continuation by reference.

FIELD OF THE INVENTION

The invention relates to a testing device for an EUV optical system. The invention furthermore relates to a generating unit for generating wavelength-variable test spectra for an EUV optical system. The invention furthermore relates to a method for testing an EUV optical system.

BACKGROUND

The most important components of conventional EUV optical systems are Bragg mirrors. In the case of the material combinations used nowadays for the abovementioned mirrors, in particular molybdenum-silicon multilayers, a broadband nature and a high reflectivity are largely ruled out for the following reason: each individual layer reflects only little light, such that high reflectivities require a multiplicity (often 60 or even more) of layers whose reflections are constructively superimposed. These high numbers of layers have the effect that the Bragg mirrors become spectrally narrowband. For EUV scanners in optical lithography, owing to the high throughput sought, it is important, however, to employ highly reflective mirrors in order that as much light as possible arrives at the wafer.

The literature discloses measurements in which various spectra were used to examine resolution limits of an EUV microscope (see e.g. Wachulak et al. 2011, Optics Express 19, pages 9541-9549).

SUMMARY

It is an object of the present invention to provide an improved device and an improved method for optically measuring EUV optical systems.

The object is achieved in accordance with a first aspect with a testing device for an EUV optical system, comprising: a generating unit generating wavelength-variable test spectra for the EUV optical system, wherein the test spectra emerging from the EUV optical system are detected with a sensor unit.

In accordance with a second aspect, the object is achieved by a generating unit generating wavelength-variable test spectra for an EUV optical system, comprising a filter unit having two oppositely arranged mirrors, wherein the filter unit comprises an entrance opening for an entrance radiation, wherein beams are multiply reflected between the mirrors, and wherein an exit radiation emerges from the filter unit through at least one exit opening.

In accordance with a third aspect, the invention provides a method for measuring an EUV optical system, which method comprises:

applying a wavelength-variable test radiation to the EUV optical system;
detecting the test radiation downstream of the EUV optical system with a sensor unit; and
evaluating the detected test radiation with an evaluation unit.

Dependent claims relate to preferred embodiments of the testing device according to the invention.

One preferred embodiment of the testing device according to the invention is characterized in that the generating unit comprises a plasma source, wherein the plasma source comprises at least one gas which emits in an operative wavelength range of the EUV optical system. By selecting a suitable gas for the plasma source, it is thus possible to provide a suitable test spectrum for the EUV optical system.

A further preferred embodiment of the testing device according to the invention provides that at least one from the group: argon, krypton, xenon, nitrogen, neon and oxygen is used as gas. As a result, gases are selected which emit in a wavelength range that is in an operative operating range of the EUV optical system. In addition, the abovementioned gases are advantageously compatible for the EUV optical system.

A further preferred embodiment of the testing device according to the invention provides that a "target spectrum" is generated with the generating unit such that at least two generated different "base spectra" are superimposed. In connection with the present application, a target spectrum should be understood to mean a spectrum which corresponds to or comes close to the spectrum under use conditions. Each individual one of the gas spectra represents a base spectrum. Advantageously, it is thereby possible to vary test spectra, which makes it possible to perform a test of the EUV optical system in one work operation, without having to adjust extensive test parameters over a long period of time. In this way, advantageously, it is not necessary to carry out or alter complex mechanical settings.

A further preferred embodiment of the testing device according to the invention is characterized in that the predefined target spectrum is approximated as well as possible by sequentially applying the base spectra to the EUV optical system. This advantageously enables sequential testing with only few base spectra.

A further preferred embodiment of the testing device according to the invention provides that a mixture ratio of the gas is variable. This affords the advantage that highly variable test spectra can be generated which can be adapted well to specific test requirements.

A further preferred embodiment of the device according to the invention is distinguished by the fact that the target spectrum is represented as a mathematical function with three parameters, wherein the parameters comprise a maximum value, a width and a central wavelength of the target spectrum. This advantageously enables the target spectrum sought to be described with only a few parameters. A number of spectra by which the target spectrum is formed can advantageously be minimized in this way.

A further preferred embodiment of the testing device according to the invention is distinguished by the fact that the generating unit comprises a filter unit having two oppositely arranged mirrors, wherein the filter unit comprises an entrance opening for an entrance radiation, wherein beams are multiply reflected between the mirrors, and wherein an exit radiation emerges from the filter unit through at least one exit opening. In this case, the two oppositely arranged mirrors are preferably embodied as fully reflective plane mirrors. Furthermore, the entrance opening can be formed in one of the two mirrors and the exit opening in the other of the two mirrors.

In this way, the desired variation in the wavelengths is provided via a spectral filter, which from a mathematical standpoint enables the same effect as through variable test spectra. A filter effect can be amplified by multiple reflections. In this case, beams can enter the filter unit with different inclinations relative to a plane defined by one of the two mirrors, wherein the beams are reflected back and forth between the two oppositely arranged mirrors. A spectrum for the EUV optical system is provided via a defined geometry of mirrors in this way.

A major advantage over conventional monochromators is that, with this principle, even many beams can be filtered all at once and reflections can be influenced very well. Every second reflection takes place again on the same mirror, wherein an increased measurement accuracy results on account of the fact that an individual mirror can generally be produced very uniformly and accurately. As a result, a base spectrum can be restricted to a desired target spectrum in this way with a relatively simple structure.

A further embodiment of the testing device provides that the two mirrors are arranged parallel or substantially parallel to one another. In this connection, substantially parallel means that an angular deviation of the two mirrors may be designed to be less, in particular significantly less, than 1 mrad.

A further preferred embodiment of the testing device according to the invention is distinguished by the fact that a test spectrum is set by a variation of a distance between entrance opening and exit opening and/or by a variation of the plate distance between the mirrors. Different possibilities for varying the bandwidth or the central wavelength of the spectral filter are advantageously provided as a result. In principle, it holds true that a bandwidth of the filter unit is dependent on a number of the reflections or double reflections, wherein the filter becomes all the more narrowband, the more reflections occur therein.

A further preferred embodiment of the testing device according to the invention is characterized in that a parallelism of the two mirrors is set. This advantageously affords a simple possibility for adjusting or setting a parallelism of the two mirrors.

A further preferred embodiment of the testing device according to the invention is characterized in that at the top side and at the underside of the filter the openings are embodied in a gridlike fashion, wherein distances between the openings are substantially identical or substantially variable depending on a coordinate alignment. In this way, a type of sieve structure is formed, with which the same wavelength is always filtered for many beams. Advantageously, such a structure is used where substantially parallel beams pass into the EUV optical system and/or emerge therefrom.

A further preferred embodiment of the testing device according to the invention is distinguished by the fact that the filter unit is arranged movably in the generating unit. An additional parameter is provided through the movability, by which additional parameter the test spectra are even more variable.

A further preferred embodiment of the testing device according to the invention is distinguished by the fact that a filter unit is arranged upstream and/or downstream of the EUV optical system. Two positions are thus available for the spectral filter, wherein, in the first case, light having a predefined, desired wavelength can enter the EUV optical system and the filter should thus be regarded as a part of the light source. In the second case, the intention is for the sensor unit to see a desired wavelength range, as a result of which the spectral filter may thus be regarded as a part of the sensor unit.

It is pointed out that aspects and details mentioned with regard to the testing device can also be applied to the generating unit and to the testing method.

It is regarded as particularly advantageous that, by utilizing the generating unit according to the invention, it is possible to test the EUV optical system substantially in its spectral range actually used. For this purpose, test spectra for mapping operative spectra of the EUV optical system are provided or test spectra substantially correspond to operative spectra of the EUV optical system. In this way, it is advantageously possible to identify faults of the optical unit at an early stage and thus to optimize a production process. The parameter of wavelength is thus varied in accordance with the invention, as a result of which the EUV optical system is qualified or quality assured.

Advantageously, it is not necessary to carry out or alter complex mechanical settings. Advantageously, it is also not necessary to use vacuum-suitable mechanisms. As a result, this advantageously provides an increase in the speed of test sequences.

The invention is described in detail below with further features and advantages with reference to a number of figures. In this case, all features described or illustrated form by themselves or in any desired combination the subject matter of the invention, independently of their compilation in the patent claims or the dependency reference thereof, and independently of their wording or illustration in the description or in the figures. The figures are primarily intended to elucidate the principles essential to the invention and are not necessarily illustrated in a manner true to scale. In the figures, identical or functionally identical elements have identical reference numerals.

DETAILED DESCRIPTION

In contrast to the prior art in accordance with Wachulak et al. 2011, Optics Express 19, pages 9541-9549, the present invention does not concern a resolution during an optical imaging, but rather a measurement of intensities and the spectral dependencies thereof.

EUV optical systems for a radiation in the nm range (soft X-ray radiation) have the general basic problem of a greatly wavelength-dependent profile of their reflectivities and/or transmissions.

Figure 1:
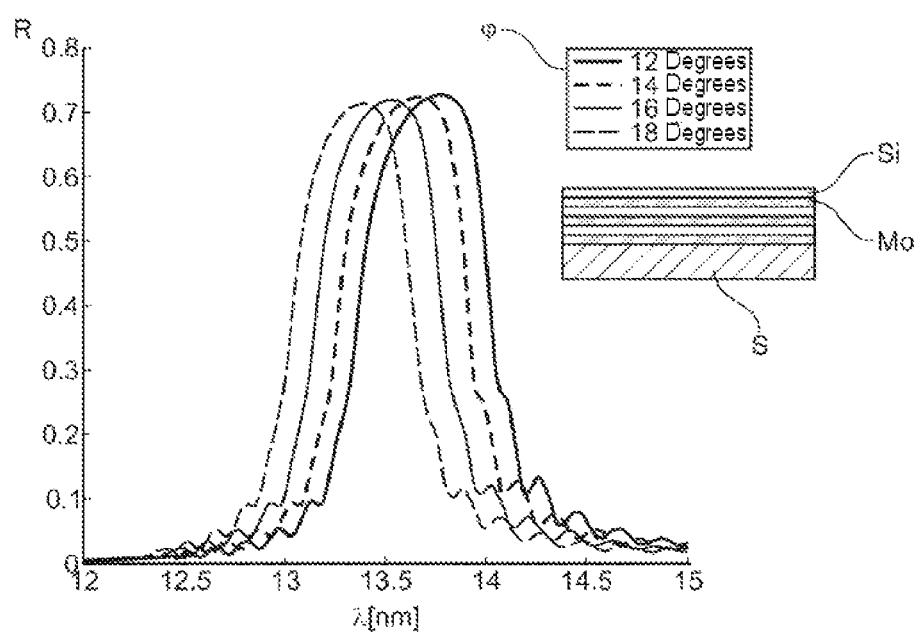
FIG. 1 shows a basic illustration of a conventional EUV Bragg mirror in accordance with the prior art and typical reflectivity curves of such a mirror.

FIG. 1 shows typical reflectivity curves of an EUV optical system for a specific angle of incidence in each case, in an illustration on the left. The illustration shows profiles of the reflectivity R for different values of the angles $\varphi$ of incidence, wherein it can be discerned that the spectral reflectivity curve of a typical mirror coating changes depending on the angle $\varphi$ of incidence. According to the known Bragg condition, the wavelength $\lambda_{max}$ at which the maximum reflectivity occurs is dependent on the angle $\varphi$ of incidence and the layer thickness $d_S$ according to the following formula:

$$dS = \lambda max/2 = \cos \varphi$$

This relationship together with the narrowband nature causes a limitation that EUV optical systems can be operated only under the angle $\varphi$ of incidence for which they were designed. FIG. 1 shows a typical structure of a conventional EUV Bragg mirror in an illustration on the right. The illustration reveals a substrate S, for example in the form of quartz, and, arranged thereabove, some MoSi layers on which silicon or molybdenum is respectively applied.

Figure 2:
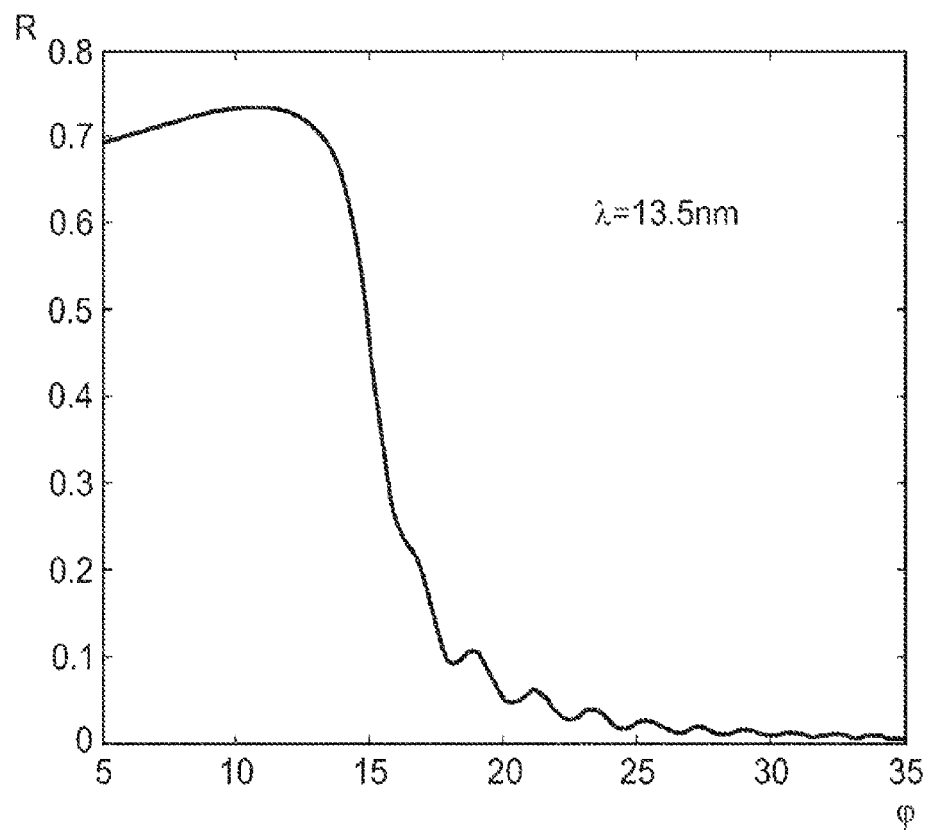
FIG. 2 shows an illustration of a typical angle dependence for the reflectivity of an EUV Bragg mirror at a fixed wavelength.

FIG. 2 shows a typical dependence for the reflectivity R of an EUV Bragg mirror on the angle $\varphi$ of incidence at a fixed wavelength $\lambda$ of 13.5 nm. It can be discerned that the mirror is designed in such a way that it reflects best at an angle $\varphi$ of incidence of approximately 10 degrees.

A further known complication of EUV optical systems is that they have to be operated in a vacuum because air absorbs the EUV radiation. The difficulties mentioned also apply, in principle, to transmissive components.

The narrowband nature of the EUV optical systems furthermore entails the fact that the transmission, reflection and other optical variables (e.g. polarizations) depend sensitively on the spectrum of the light source, particularly if a sensor system used also does not contain a spectral filter. It is therefore difficult and requires correction calculations to test the optical systems under conditions which do not correspond to the later conditions of use.

However, such tests are often necessary in the production of EUV optical systems, particularly if parts of the optical system have to be tested separately before incorporation into an overall machine.

Since all known EUV light sources (generally plasmas) are polychromatic, with regard to this aspect for optical testing it would be necessary actually to use the same light source as is also used later in the application. If other EUV optical systems are situated between the actual light source and the part to be tested and influence the spectrum, strictly speaking these optical systems would also have to be reproduced as part of the test set-up. However, a series of advantages are afforded if the optical systems do not have to be tested with exact simulation of the conditions of use. It would be desirable to optimize an optical test measurement in such a way that the set-up reacts to errors (e.g. adjustment errors) as insensitively as possible, such that flexibility is particularly important here, while a high light power, for example, can usually be dispensed with. In addition, alternative light sources may be less expensive and smaller.

However, the use of a different light source generally has the effect that it is necessary to employ a different spectrum which is closely associated with the technology used for generating light (e.g. laser-induced plasma or arc discharge) and a source geometry of the light source. In other words, it is necessary here to find a compromise between a spectrum that is as close as possible to the application and a sufficiently flexible measurement set-up.

However, if an optical measurement variable is then measured using a specific polychromatic source spectrum, with this alone it is not yet possible to accurately predict what value said measurement variable would have for a different polychromatic source spectrum. Such a prediction requires additional information, either by ensuring the quality of the individual components and of the adjustment, or by testing the spectral properties of the optical system.

When testing individual mirrors it is customary practice to use tunable monochromators or spectral filters for such spectral characterizations. However, this method is disadvantageously very complex and time-consuming because the currently known monochromators (Bragg mirrors, diffraction gratings or crystals) function only at specific angles of incidence, such that only beams with a very small aperture angle can be made sufficiently monochromatic.

It is therefore known to be difficult to illuminate an entire aperture of an EUV optical system all at once with monochromatic light. A measurement spectrally filtered using Bragg mirrors, diffraction gratings or crystals is therefore possible only serially, which means that the entire input aperture of the optical system has to be scanned with a thin beam.

The measuring methods described are therefore slow and additionally inexpedient for a high measurement accuracy, firstly because drifts may occur in the case of long measurement times, but also secondly because the monochromators and spectral filters for tuning the wavelength have to be mechanically moved (e.g. tilted). Owing to the great angle dependence of the optical properties of the test specimen, in the case of all movements it is necessary carefully to ensure that the angles of incidence are always complied with accurately enough; in addition, all actuators must also function in a vacuum.

Spectral filters in the EUV range function over angle-dependent reflectivities (crystal monochromator, Bragg mirrors with multilayers) or transmissions (free-standing multilayers). Bragg mirrors and transmissive multilayers have the advantage over crystals and gratings that the filter properties may be determined by a variation of the layer structure. However, transmissive components are very sensitive and therefore used only to a limited extent. In the case of mirror systems, the difficulty is that for a good filter effect a plurality of mirrors have to be disposed one behind another. The individual mirrors have to be adjusted with respect to one another and with respect to the incident beam in such a way that the intended angle of incidence is complied with accurately enough upon every reflection. If it were desired to construct a tunable filter (spectrally or for different angles of incidence), all mirrors must be moved with high precision. This requires a high outlay concerning set-up and components, especially since the set-up must also still be vacuum-suitable since EUV light is absorbed in air.

Figure 5:
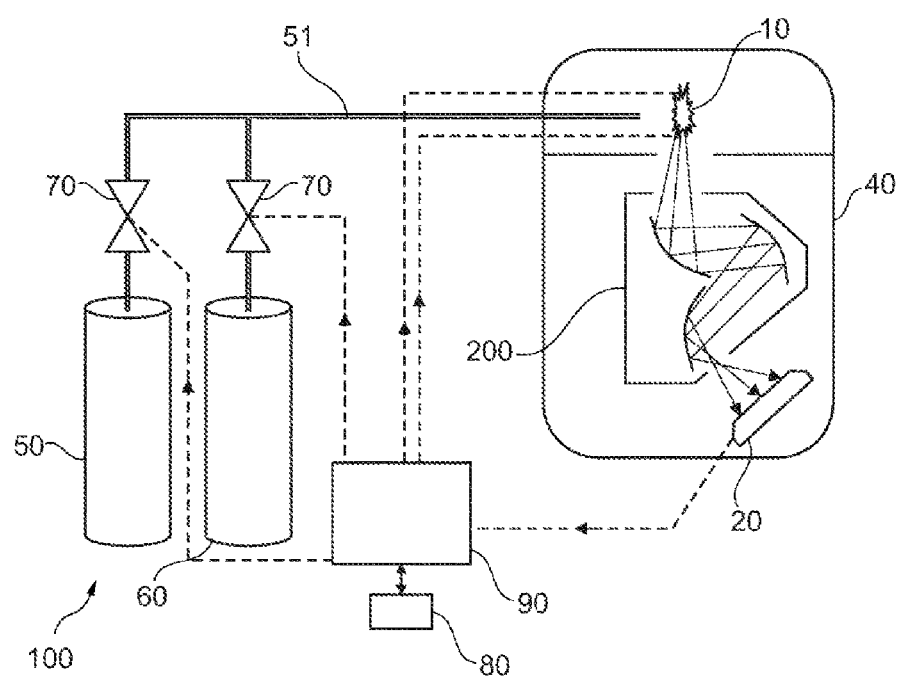
FIG. 5 shows a basic illustration of one embodiment of the testing device according to the invention.

The invention proposes testing the EUV optical systems using a plurality of non-monochromatic spectra (so-called "base spectra"). What can thus be achieved in principle is that spectral information about the test specimen in the form of the EUV optical system can be obtained without mechanical movements of test set-ups. FIG. 5 schematically shows a corresponding basic test set-up.

If the base spectra or at least their differences are known and the values of the optical intensity measurement variables of interest are measured for each spectrum (or the differences which occur upon a change in the spectra), it is thus also possible to forecast the measurement values for each spectrum which can be represented as a linear combination of the base spectra. In this case, use is made of the linearity of the optical transmission: An intensity profile at a sensor unit 20 (see FIG. 5) for a base spectrum I1 can be represented as follows:

$$I1, \text{Sensor} = \int_{-\infty}^{+\infty} (T(\lambda, x) \times I1(\lambda)) d\lambda$$

An intensity profile at a sensor unit 20 for a base spectrum 12 can be represented as follows:

$$I2, \text{Sensor} = \int_{-\infty}^{+\infty} (T(\lambda, x) \times I2(\lambda)) d\lambda$$

Figure 3:
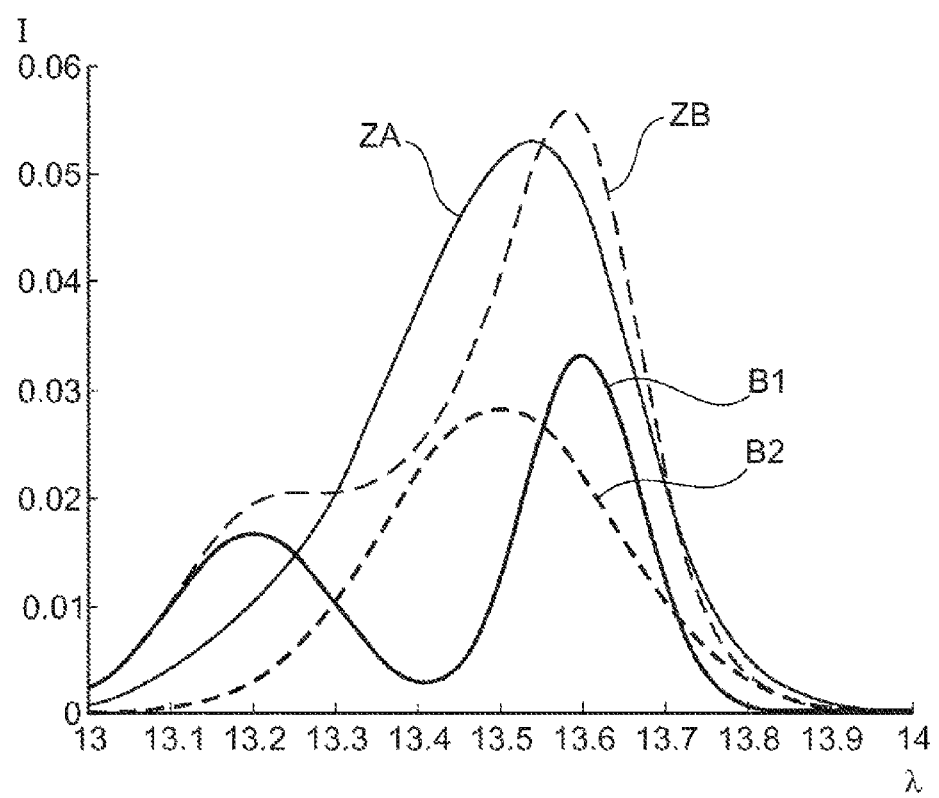
FIG. 3 shows a basic illustration of a superimposition of base spectra.

An intensity profile at the sensor unit 20 for a linear combination of the base spectra I1 and I2 can be represented mathematically by the following formula (1):

$$ISensor(\lambda, x, a) =$$
$$\int_{-\infty}^{+\infty} (T(\lambda, x) \times [(1-a) \times I1(\lambda) + a \times I2(\lambda)]) d\lambda = (1-a) \times I1,$$
$$\text{Sensor}(\lambda, x) + a \times I2, \text{Sensor}(\lambda, x)$$

with the parameters:
$\lambda$ wavelength
x spatial coordinate on the sensor
T spectral transmission (or reflectivity) of the test specimen to be measured
a freely selectable parameter between 0 and 1
$I_1, I_2$ spectra of the light source or of the light source with downstream optical test set-up I1,Sensor, I2,Sensor spectra at the sensor behind the test specimen with knowledge of the base spectra $I_1$ and $I_2$, formula (1) can be used to deduce from the measurable variables $I_{1,Sensor}$ and $I_{2,Sensor}$ the value $I_{Sensor}$ for different values of the parameter a, which describes the linear combination of the spectra. Corresponding formulae hold true for three or more base spectra. If only differences of base spectra are known, for respectively two spectra it is possible to use the following formula (2) for a differential measurement:

$$I2, \text{Sensor}(\lambda, x) - I1, \text{Sensor}(\lambda, x) = \int_{-\infty}^{+\infty} (T(\lambda, x) \times [I2(\lambda) - I1(\lambda)]) d\lambda$$

the linear combinations of base spectra according to formula (1) are illustrated pictorially in FIG. 3. It can be discerned that linear combinations of the base spectra B1, B2 can be combined to form target spectra ZA, ZB.

The invention proposes using this principle when technically implemented for the testing of EUV illumination systems which, for cost reasons, cannot be qualified with an LPP (laser produced plasma) source used later in a scanner. Applications for other EUV optical systems and also individual component measurements are equally conceivable.

In particular, arc discharge plasma sources (DPP sources, discharge produced plasma) are suitable for the practical implementation since here ideally only a different gas has to be introduced and, if appropriate, the striking voltage has to be adapted. Examples of various noble gas spectra with which such a measurement may be performed are illustrated in FIG. 4.

Figure 4:
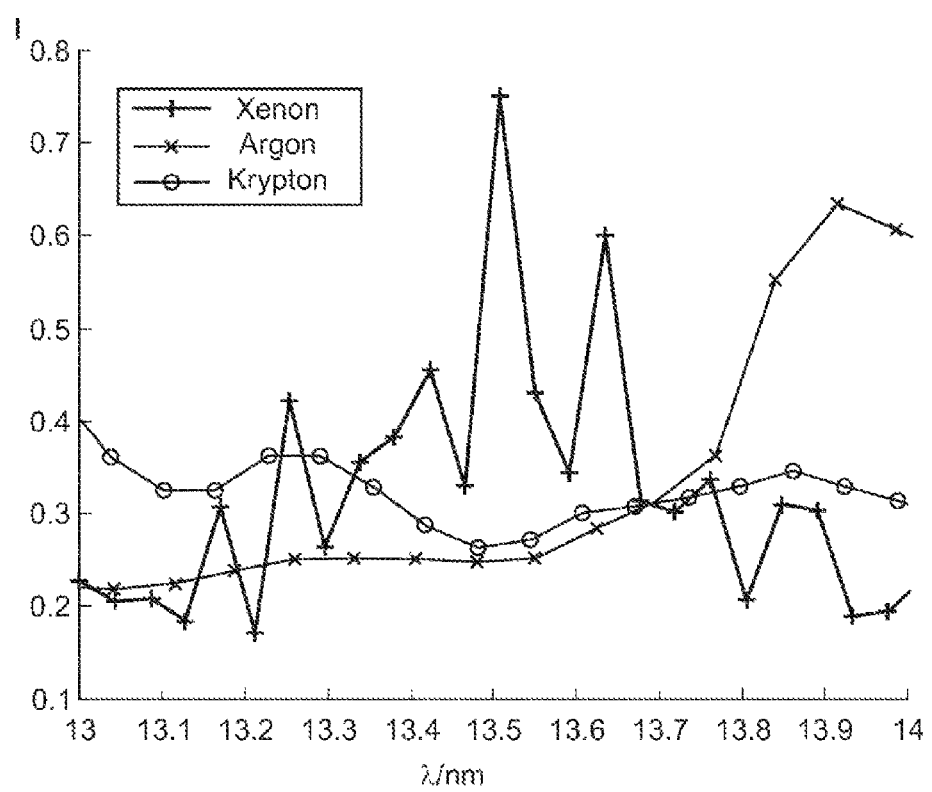
FIG. 4 shows basic illustrations of the spectra of noble gases.

FIG. 4 shows excerpts from spectra of the noble gases xenon, argon and krypton.

If the location of the plasma is defined sufficiently accurately by the electrode geometry, in this way it is possible to examine the reaction of the EUV optical system to be tested to spectral changes, without having to mechanically move an optical part of the measurement set-up. Consequently, the high mechanical accuracy requirements of conventional monochromators and spectral filters which function by way of a change of angle of incidence are advantageously obviated. What is primarily achieved is a spectral characterization in the context of a parallel and thus time-saving measurement method in which the entire input aperture of the EUV optical system is illuminated geometrically in the same way as in later use.

FIG. 5 shows a basic structure of one embodiment of the testing device 100 according to the invention. The EUV optical system 200 to be tested comprising Bragg mirrors is arranged in a vacuum chamber 40. Arranged in a separated section of the vacuum chamber 40 is a generating unit 10 in the form of an arc discharge plasma light source, which is fed by two gases 50, 60 via a gas line 51. Using a control unit 90, valves 70 for the gases 50, 60 may be controlled and a mixture ratio of a gas for the plasma light source may thus be set. A spectrum of the light source may vary in accordance with the variable gas mixture for the light source. An automation of a complete test series for the EUV optical system 200 is advantageously made possible through the control unit 90. An evaluation unit 80 (for example an electronic computer unit) is functionally connected to the control unit 90 and serves for evaluating detected signals of a sensor unit 20. A computer-implemented method may thus proceed on the control unit 90 and thus perform an automated test series.

As a result, the plasma light source may generate very variable spectra, wherein the EUV optical system 200 ("test specimen"), without having to be moved, has applied to it successively base spectra which in a superimposition yield or at least approximate a predefined target spectrum Z for the EUV optical system 200. As a result, the EUV optical system 200 may be qualified in a manner that greatly conserves resources. The sensor unit 20 is arranged downstream of the EUV optical system 200 and detects the test radiation emerging from the EUV optical system 200. The sensor unit 20 is functionally connected to the control unit 90, as a result of which a feedback of the entire qualification mechanism is realized.

Mixtures of the two gases 50, 60 may advantageously also be used. In this connection, mixing means that situations in which the parameter "a" from formula (1) may assume continuous values of between 0 and 1 may be established with the measurement set-up illustrated. In this way, the prediction according to formula (1) may be validated by an additional measurement of the gas mixture. As a consequence, the gas composition is changed in such a way that, depending on the base spectrum to be generated, either gas 50 or gas 60 or a mixture of the gases 50 and 60 is used.

In order to maximize an information content of the test measurement, the base spectra should be selected in particular according to the following two criteria:
(i) The differences in the spectra ought to be large in those wavelength ranges at which possible adjustment, coating or other production faults of the EUV optical system 200 to be qualified have a particularly significant effect.
(ii) The target spectrum, that is to say the source or input spectrum, for which the EUV optical system 200 to be tested is designed ought to be approximated as well as possible by a linear combination of the base spectra.

A number of necessary base spectra depends on the amount of information desired to be obtained from the measurement. If the transmission properties of the EUV optical system 200 to be qualified, the target spectrum or else both have structure-poor spectral profiles, a smaller number of base spectra tends to suffice.

Figure 6:
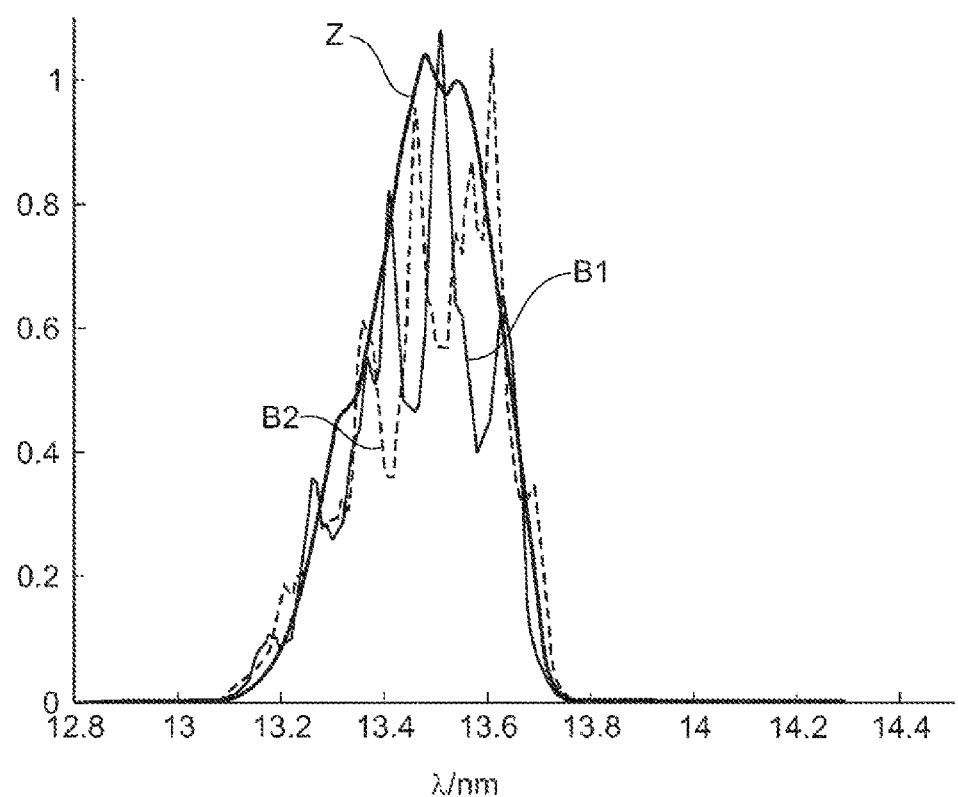
FIG. 6 shows an approximation of a target spectrum by two base spectra.

In the case of smooth reflectivity profiles, which generally are always provided, narrowband line spectra may also be used for approximating the target spectrum, as is illustrated for example in FIG. 6.

FIG. 6 shows an approximation of a target spectrum Z by two base spectra B1, B2 with spectral lines, which represents a situation at the sensor unit 20 in which the transmission of the test specimen makes the spectra narrowband. In this way, the target spectrum Z is represented mathematically with three parameters, wherein the parameters comprise a maximum value, a width and a central wavelength of the target spectrum Z. An asymmetry parameter of the target spectrum Z would also be conceivable as a further optional parameter.

Furthermore, it is also possible to sensitize the test method with regard to probable production faults of the EUV optical system 200 (e.g. adjustment, layer thickness, layer roughness, etc.). Each production fault to be detected which can differ spectrally from others requires an additional base spectrum in this case. Therefore, firstly a model that is parameterized as economically as possible is established for the spectral sensitivities of the EUV optical system 200, the parameters of which model can be calculated from measurement values obtained with the various spectra.

An example with just a single test parameter, namely the spectral width of the EUV optical system 200, is illustrated in FIGS. 7A-7E. It can be discerned that the base spectrum B2 reacts sensitively to a position of reflectivity edges, such that, in comparison with the other base spectrum B1, in the case of broadband reflectivity R, it arrives at the sensor unit 20 with a higher total intensity (see FIG. 7e) than in the case of narrowband reflectivity R (see FIG. 7d). If the sensor unit 20 measures the total intensity, that is to say that it performs spectral integration, the spectral widths of the reflectivity curves can be deduced from the ratio of the sensor signals.

FIGS. 7A-7E show examples for testing with regard to the width of the spectral reflectivity curve. For the sake of simplicity, an individual Bragg mirror was assumed here as test specimen, but multi-component EUV optical systems 200 can be tested in exactly the same way.

Figure 7A:
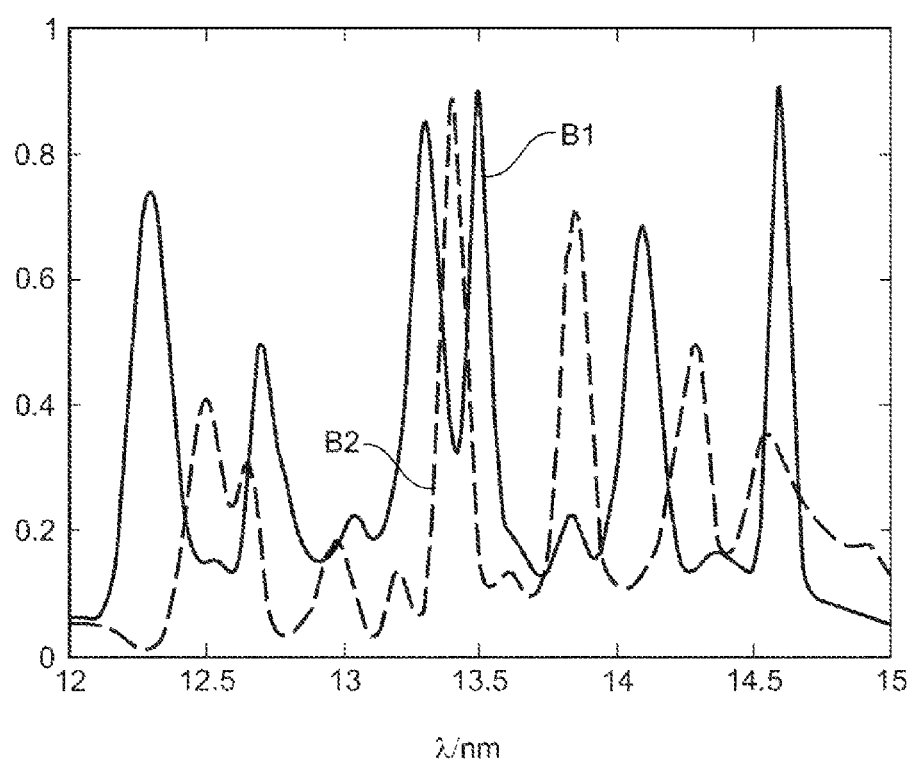
FIGS. 7A-7E show examples for testing with regard to the width of the reflectivity curve under consideration.

FIG. 7A shows two assumed base spectra B1 and B2, such as might be used for measurement.

Figure 7B:
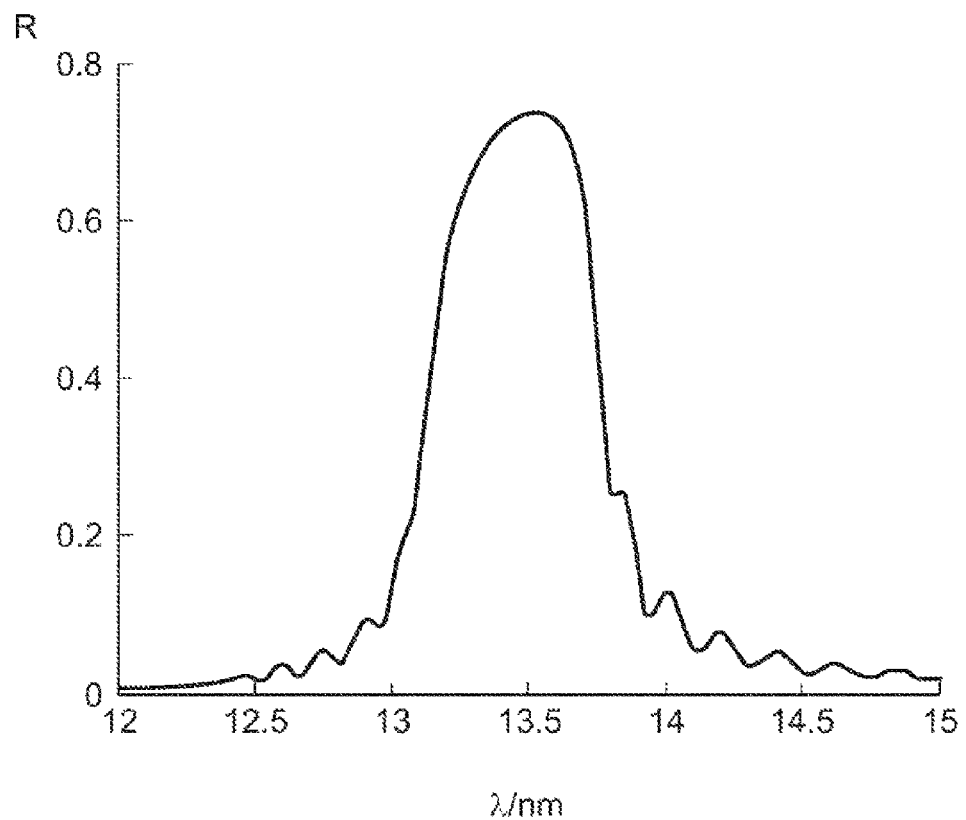

FIG. 7B shows a setpoint profile of a narrowband reflectivity curve of the Bragg mirror.

Figure 7C:
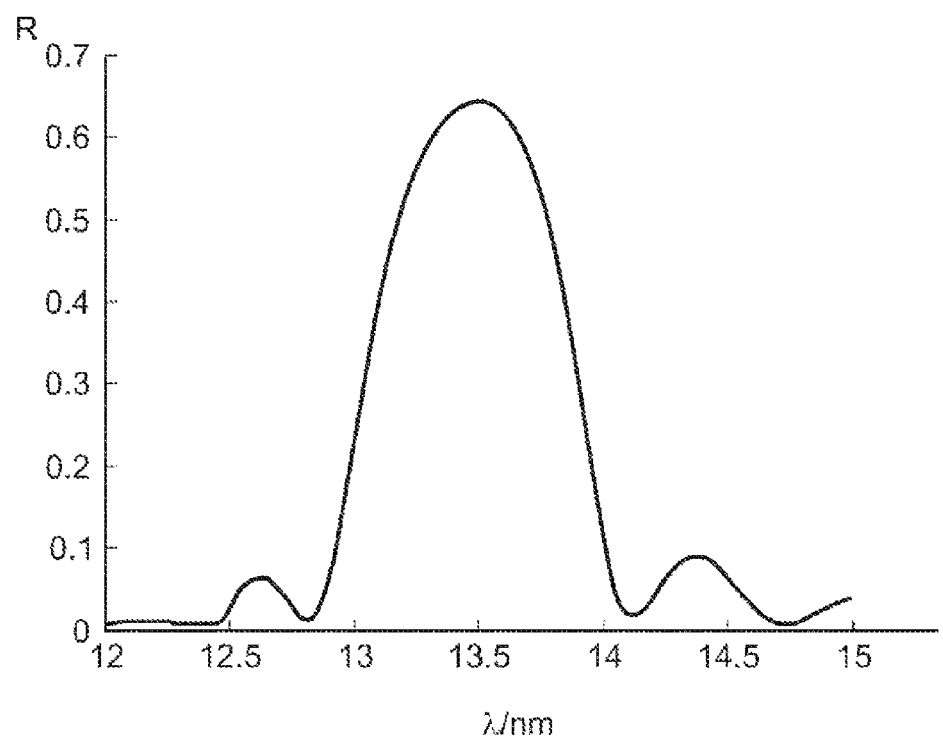

FIG. 7C shows an actual profile of a broadband reflectivity curve of the Bragg mirror.

Figure 7D:
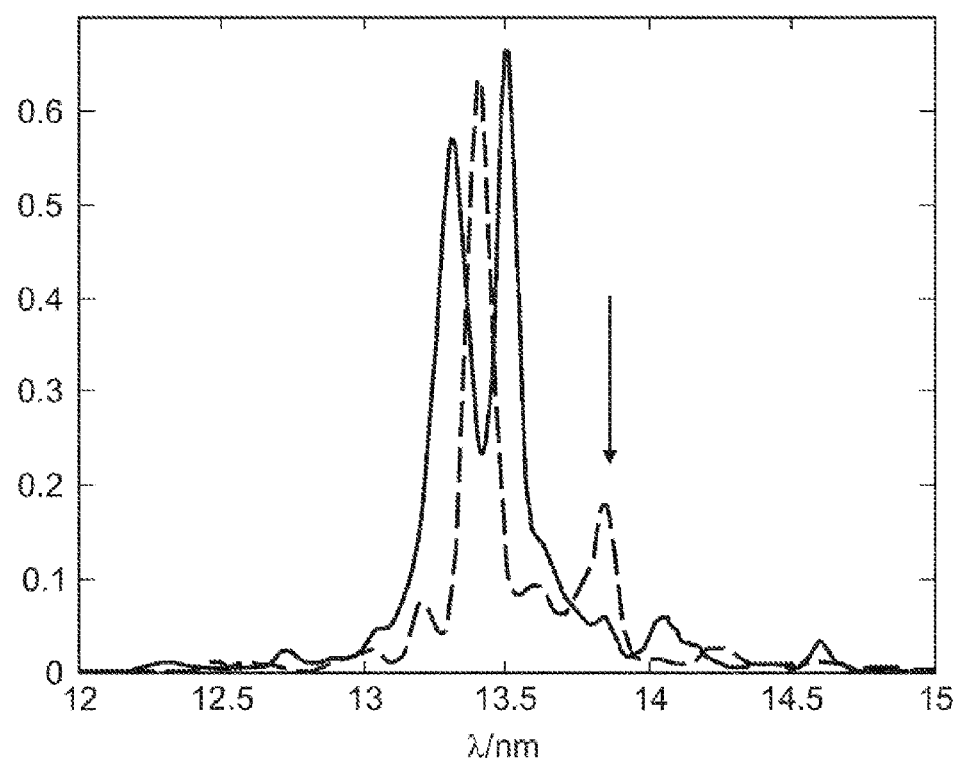

FIG. 7D shows a spectrum at the sensor unit 20 in the case of the narrowband reflectivity curve: the peak—marked by an arrow—of base spectrum B2 at the edge of the reflectivity curve in FIG. 7B is suppressed.

Figure 7E:
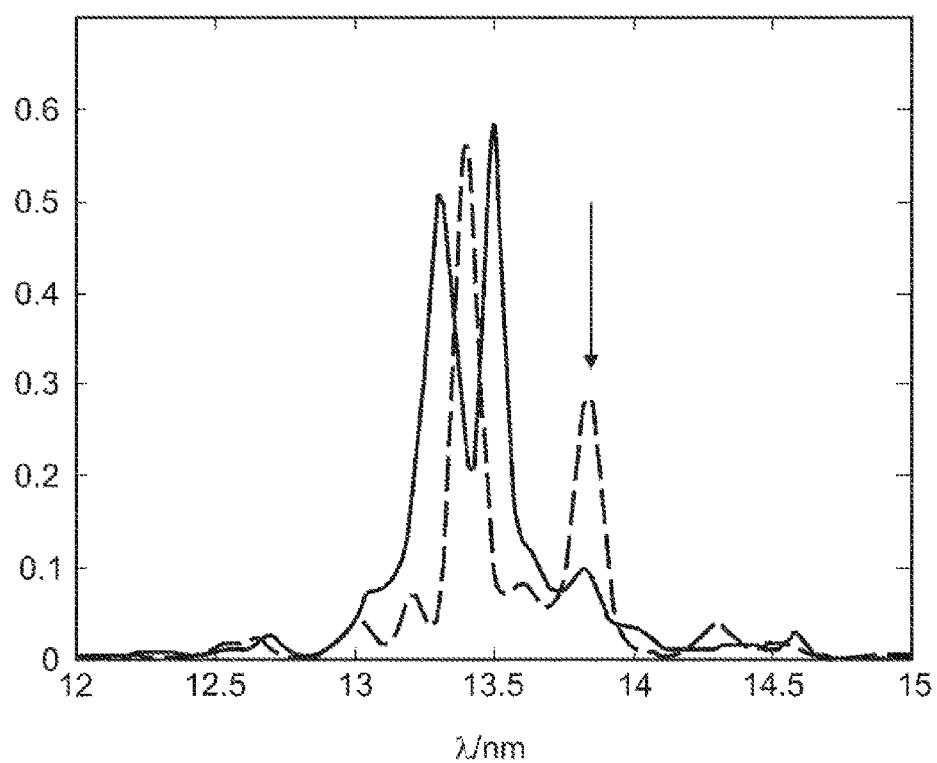

FIG. 7E shows a spectrum at the sensor unit 20 in the case of the broadband reflectivity curve from FIG. 7C: It can be discerned that the marked peak of base spectrum B2 is formed significantly more intensively in comparison with FIG. 7D. In addition, it is discernible that as a result the spectrally integrated total intensity varies to a greater extent in the case of B2 than in the case of B1. This is also discernible from the abovementioned formulae (1) and (2) involving integration over the wavelength λ.

The procedure described presupposes that the base spectra B1, B2 themselves may be measured accurately enough to know their properties as a result. A calibration measurement required for this purpose is preferably performed once upon the start-up of a test set-up, wherein the information obtained in the process may then be used for numerous subsequent test measurements. Conventional monochromators in which mechanical accuracies are important are preferably used for the measurement of the base spectra B1, B2.

Filters may be used as part of the light source, i.e. of the test set-up, in order to vary the spectrum. In this case, for the spectral effect it is unimportant whether the filter is situated upstream or downstream of the test specimen because, from a mathematical standpoint, all spectral transmissions/reflectivities situated in the beam path are multiplied independently of the order of the components.

Figure 8:
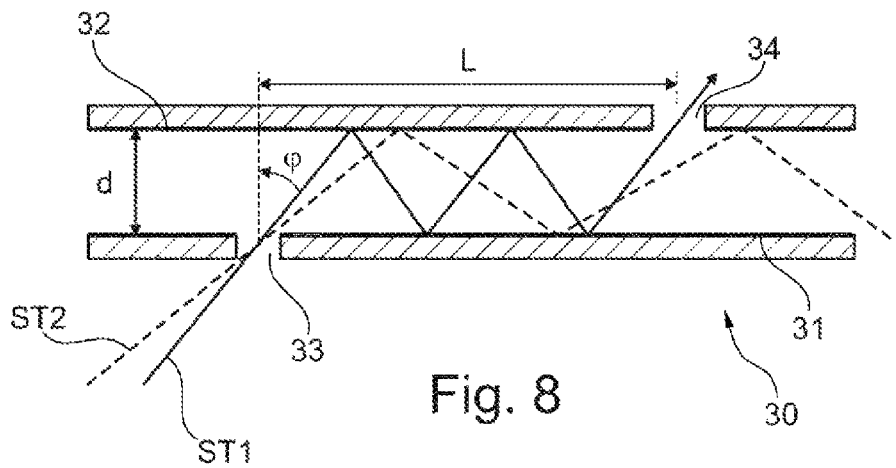
FIG. 8 shows a basic illustration of a spectral filter of the testing device according to the invention.

FIG. 8 shows in principle a filter unit 30—embodied as a spectral filter—of one embodiment of the testing device 100 according to the invention. In this case, a first mirror 31 is arranged opposite a second mirror 32, wherein beams ST1, ST2 enter an entrance opening 33 and are reflected multiply between the two mirrors 31, 32 so as then to emerge again from the filter unit 30 at an exit opening 34 upon fulfillment of an emergence condition. Preferably, the two mirrors 31, 32 are arranged parallel to one another or substantially parallel to one another. The intention here is to implement an angular deviation from a parallelism of significantly less than 1 mrad. The mirror 31 comprising the entrance opening 33 is preferably embodied as a fully reflective plane mirror. The mirror 32 comprising the exit opening 34 is preferably embodied as a fully reflective plane mirror.

In this connection, substantially parallel may mean that a deviation of the two mirrors 31, 32 from a parallelism in the micrometers range is acceptable if a length of the mirrors 31, 32 is in each case approximately a few cm. It can be discerned that, from the beams ST1, ST2 entering the entrance opening 33, only a first beam ST1 emerges again from the filter unit 30 at the exit opening 34. This is made possible by virtue of the fact that the first beam ST1 has a "correct" angle φ of incidence relative to a perpendicular to the mirrors 31, 32. The beams ST1, ST2 thus enter the filter unit 30 with different "inclinations" relative to a plane defined by the mirror 31 and are reflected between the mirrors 31, 32. As a result, this enables a filtering of a broadband radiation spectrum, wherein the filter effect is defined by the structure of the reflective layer stack and the angle φ of incidence. FIG. 1 reveals by way of example how a variation of the angle of incidence may affect the spectral profile of the reflectivity; FIG. 2 likewise illustrates by way of example the angle dependence for the spectrally integrated total reflectivity of a typical layer stack.

A number of the reflections of the beams ST1, ST2 may be set using a distance L between the two openings 33, 34. In this way, a multiple reflector principle comprising two mirrors 31, 32 is thus realized in which the correct angle of incidence is selected using the entrance hole 33 and the exit hole 34. This principle affords a number of advantages:

Just two mirrors 31, 32 have to be produced and adjusted. The mirrors are preferably plane mirrors, which are relatively simple to produce. The openings 33, 34 ensure that only beams having the "correct" angle φ of incidence pass through. The coating of the respective mirrors 31, 32 is embodied substantially identically at all reflection points because it was produced in a single coating process (possibly both mirrors 31, 32 may also be coated in the same process).

In total, this advantageously supports a constancy of a spectral filter effect. Advantageously, the filter unit 30 additionally has a polarizing effect, particularly if it is designed for an angle of incidence of approximately 45°. Upon every reflection, the p-polarization component, the electric field of which lies in the plane of incidence, is attenuated systematically to a greater extent than the s-polarization component, the electric field of which lies perpendicular to the plane of incidence. This effect is greatest for angles of reflection near 45° because the refractive indices of all materials in the EUV range are very close to 1, thus resulting in a Brewster angle of close to 45°. On account of the fact that the EUV optical system 200 to be tested generally also has polarization properties, the polarizing property of the filter unit 30 may be used for qualification purposes.

Figure 9:
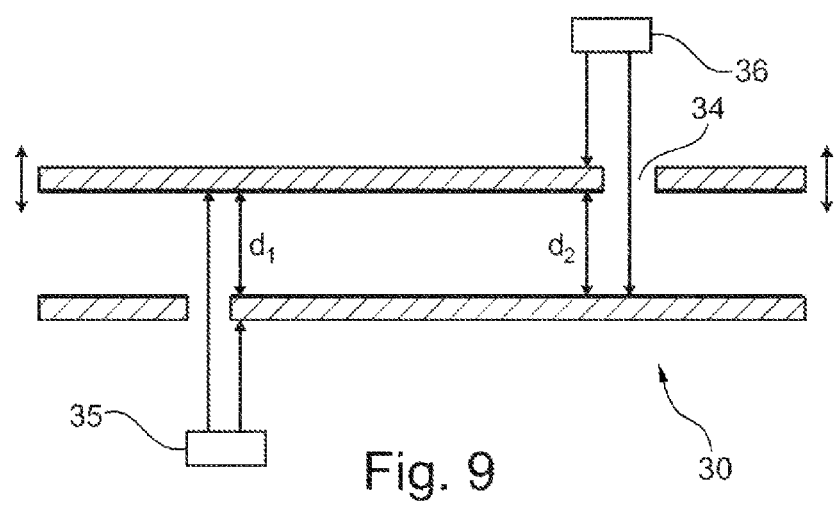
FIG. 9 shows a basic illustration of an auxiliary structure for adjusting the spectral filter from FIG. 8.

FIG. 9 shows in principle a possibility of how a parallelism and a distance of the mirrors 31, 32 can be adjusted interferometrically. The illustration shows an auxiliary set-up for an adjustment of the mirrors 31, 32 using differential interferometers 35, 36. Plates comprising the mirrors 31, 32 have to be adjusted in such a way that the two distances $d_1$ and $d_2$ become substantially equal in magnitude and attain a predefined target value d, such that a high degree of parallelism of the mirrors 31, 32 is achieved, as a result of which an accuracy of the filter unit 30 is provided. In this case, accuracies in the micrometers range are normally sufficient and may be attained in a simple manner in the context of a production accuracy. The longitudinal distance L between the openings 33, 34 likewise has to be adjusted, for example by irradiation at a defined irradiation angle with respect to the surface of the lower mirror 31. Additional adjustment devices (not illustrated) are required for this purpose.

By varying the distances d and L in a controlled manner with the aid of an actuator, it is possible to tune the filter effect of the filter unit 30. In this case, all degrees of freedom of the respectively displaced mirror 31, 32 have to be known precisely enough, advantageously only for a single mirror 31, 32, in contrast to conventional solutions. Small displacements have the effect that the spectral filter 30 is tuned to other angles of incidence; by way of example a displacement of the upper mirror 32 in FIG. 8 toward the right would block the beam ST1 and transmit the beam ST2. The angle dependence of typical mirror coatings can be gathered from the reflectivity profiles in FIGS. 1 and 2.

The mirror distance d could also be reduced in order to achieve the same effect. With this use it must be taken into consideration that the coating of the mirrors 31, 32 must still be able to reflect for the changed angles of incidence. What may be achieved with large displacements is that a beam is reflected two, four, . . . 2n times more frequently or less frequently. In this way, therefore, the quadruple filter in FIG. 8 could be made into a double or six-fold filter and information about the spectrum of the incident light could be obtained in this case.

For an odd number of reflections, the entrance and exit openings 33, 34 should be arranged on the same mirror 31, 32, which is advantageous in the adjustment because it is possible to measure the hole distance L under a microscope and additional adjusting units are obviated. For the tuning of the filter unit 30, only the mirror distance d is then available as a degree of freedom.

Figure 10:
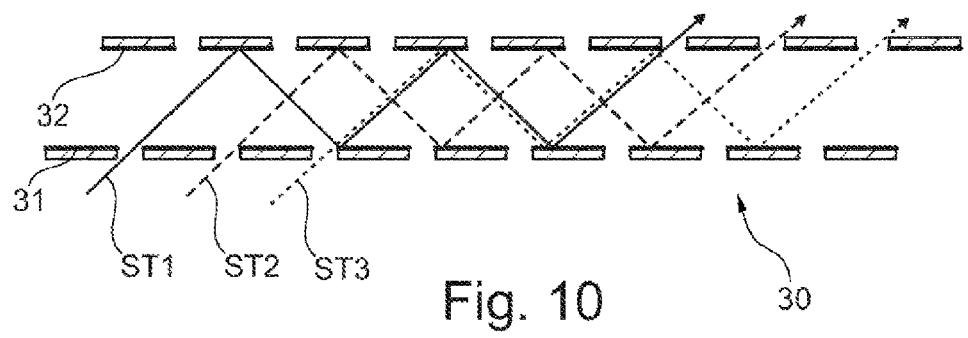
FIG. 10 shows a basic illustration of a further spectral filter of the testing device according to the invention.

FIG. 10 corresponds in principle to the arrangement from FIG. 8 with the difference that now the filter unit 30 is provided for any desired number of beams. FIG. 10 shows in principle and by way of example how the filtering principle may be extended to a parallel measurement of a plurality of beams ST1, ST2, and ST3.

Figure 11:
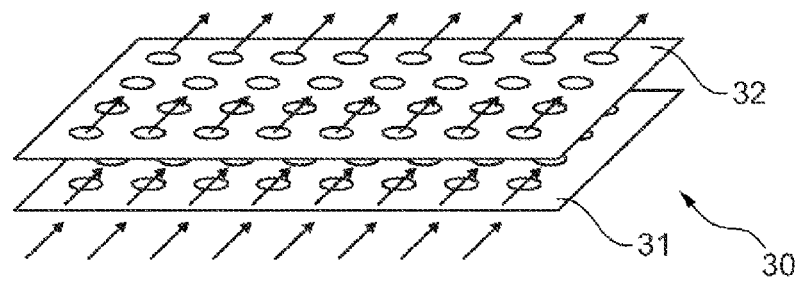
FIG. 11 shows a perspective illustration of the spectral filter from FIG. 10.

The measurement of a two-dimensional field with two mirrors 31, 32 perforated in a sievelike fashion is likewise possible, as illustrated in FIG. 11. For the "sieve reflector" formed thereby, in the case of a square hole grid, a rotary-sliding self-calibration is conceivable in which a calibrating sensor is rotated by multiples of 90° or displaced by multiples of the hole distance. From the condition that for each of these comparable operations the measurement result should ideally remain the same, possible errors of the sensor may be identified and, if appropriate, taken into account as correction.

Figure 12:
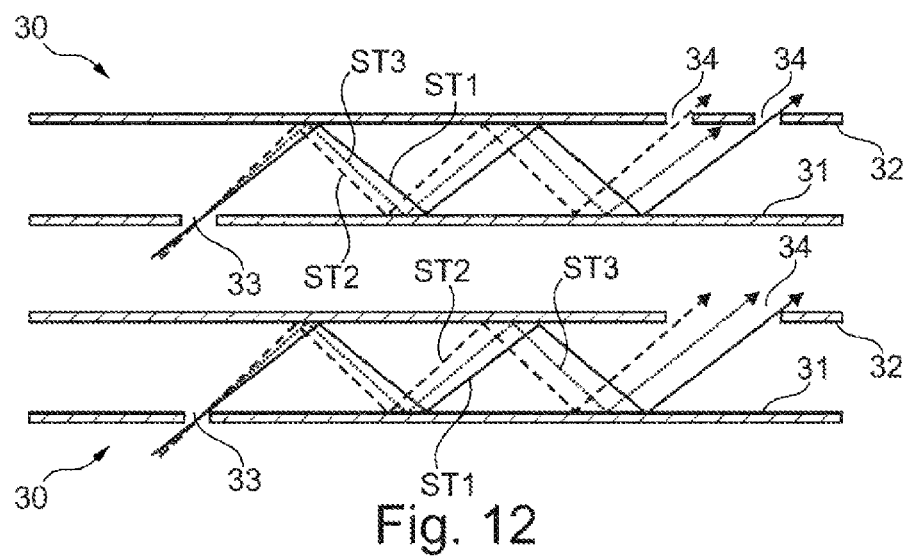
FIG. 12 shows two possible variants of spectral filters of the testing device according to the invention.

FIG. 12 illustrates how the filtering of a divergent beam emanating from a point can be realized. In this case, the figure shows two possible variants for filtering a beam having a finite aperture angle, wherein a sieve variant with a plurality of exit openings 34 is illustrated in the upper illustration and a variant for the entire aperture angle with a single exit opening 34 is illustrated in the lower illustration.

Figure 13:
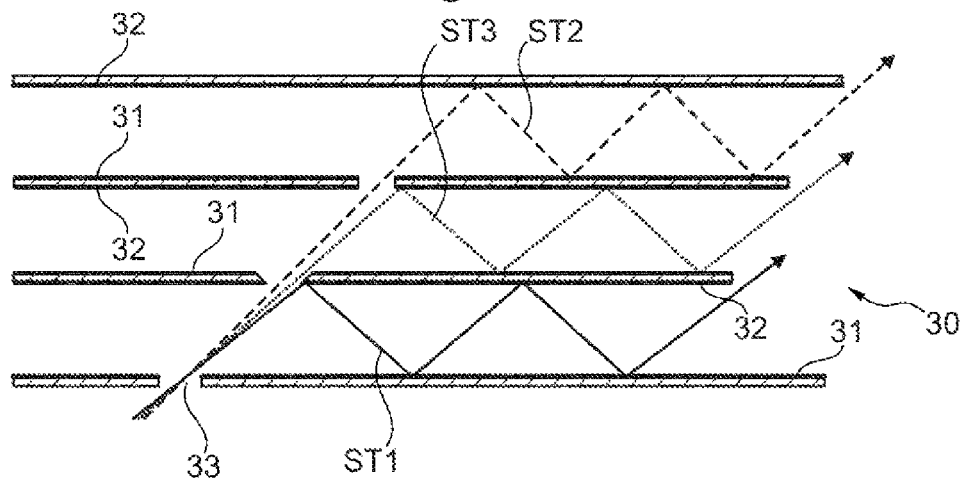
FIG. 13 shows a basic illustration of a further variant of a spectral filter of the testing device according to the invention.

FIG. 13 shows a further variant, in which a similar effect may be achieved with a stacked multiple reflector. Such filter units 30 may be used for sensors and light sources having an aperture of finite size.

The proposed filter units 30 may be used in optical measurement and/or testing technology, for example, in order that EUV optical systems 200 which are provided for a use with narrowband EUV light may also be tested with a broadband light source. By fitting the filter unit 30 behind the light source, it is possible to limit the spectrum thereof to the "correct" range and, if appropriate, to vary it with the described geometrical degrees of freedom of the filter unit 30.

Figure 14A:
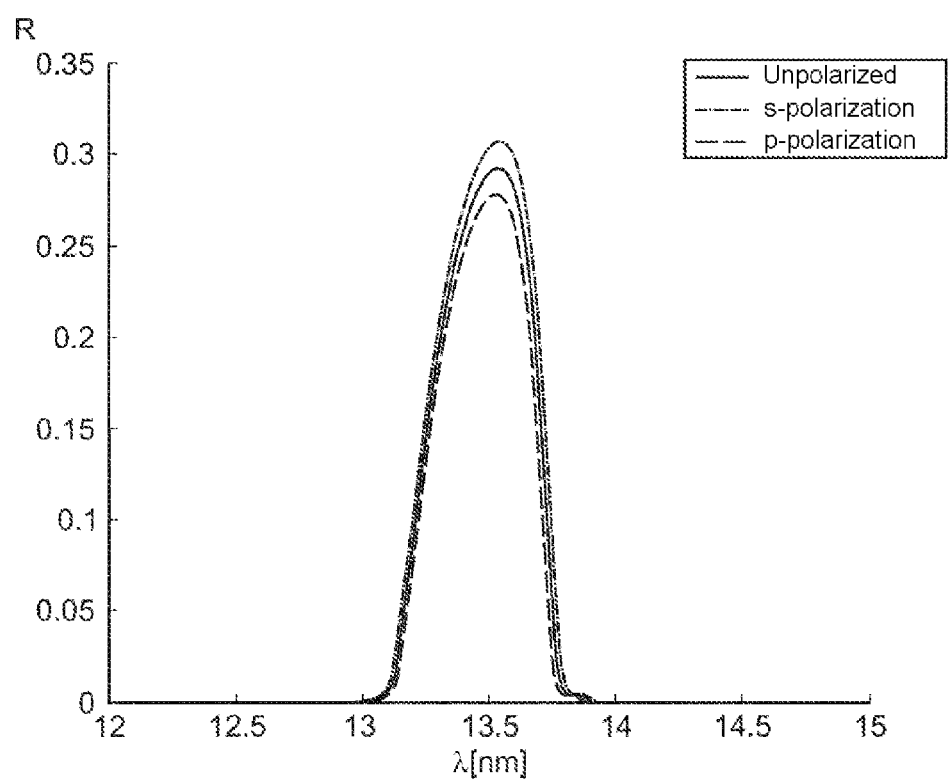
FIGS. 14A-14C show typical filter transmission curves in the case of a conventional coating of the spectral filters.
Figure 14B:
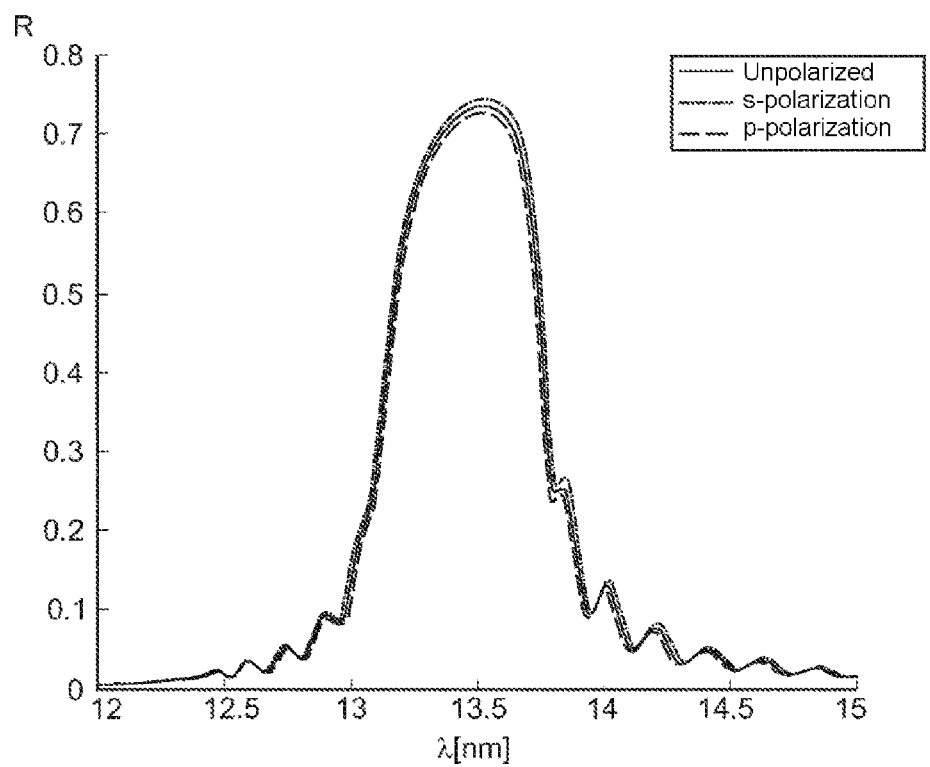
Figure 14C:
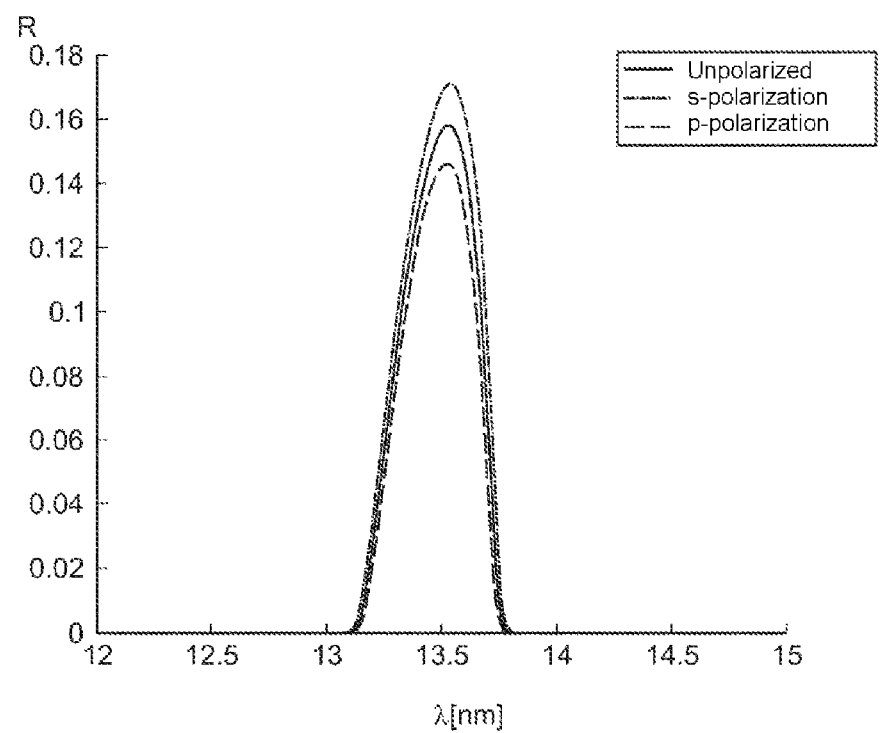

FIGS. 14A-14C show three typical filter transmission curves in the case of a conventional coating of the EUV optical system 200:

Three illustrations illustrate the transmission curves after one reflection (FIG. 14B), after four reflections (FIG. 14A) and after six reflections (FIG. 14C), from which it can be discerned that the bandwidth of the filter transmission curve becomes narrower as the number of reflections increases. As a result a bandwidth of the filter unit 30 is set using the number of reflections. It is discernible that unpolarized light (solid profile), a p-polarized component (dashed profile) and an s-polarized component of the incident light (dotted profile) on the filter unit 30 are affected by the bandwidth narrowing.

Figure 15:
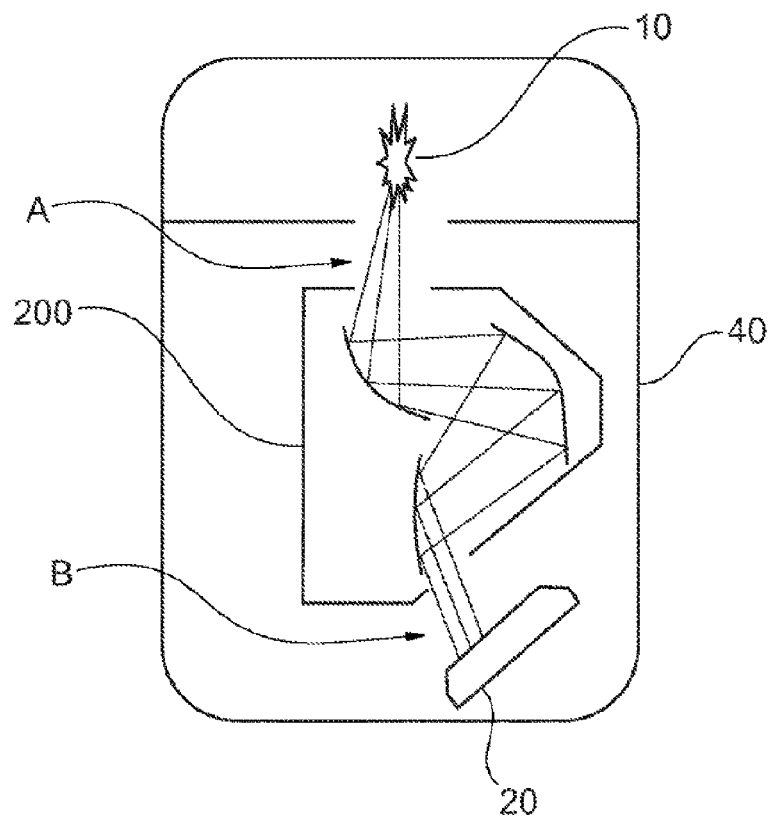
FIG. 15 shows a detail of a further embodiment of the testing device according to the invention.

FIG. 15 shows a detail of one embodiment of the optical testing device 100 with two exemplary, possible positions A, B of the filter unit 30. In position A (downstream of the generating unit 10), the light beams are divergent; a filter unit 30 as illustrated in FIG. 12 or 13 can be incorporated here. In position B (upstream of the sensor unit 20), parallel beams are available; a filter unit 30 as illustrated in FIG. 10 or 11 would be possible here. The arrangement of the filter unit 30 upstream of the EUV optical system 200 (position A) supports the fact that light having the "correct" wavelength radiates into the EUV optical system 200. An arrangement of the filter unit 30 in position B downstream of the EUV optical system 200 makes it possible for the sensor unit 20 to detect the "correct" wavelength range. In this case, the filter unit 30 may be integrated into the sensor unit 20. As a result, the filter unit 30 is used as part of the sensor unit 20.

In the two filter positions A and B, the same filter effect may indeed be achieved, wherein preferably that one of the positions A, B is chosen for which the filter unit 30 can be realized better with the beam geometry predefined by the test specimen. This is because the choice of the filter geometry and the coating is dependent on the beam geometry, as a result of which a production outlay of the filter units 30 may be different.

However, it is also conceivable, of course, for the shown geometries of the beam paths into the EUV optical system 200 and out of the EUV optical system 200 to be exactly reversed, as illustrated in FIG. 15. It is also conceivable to arrange a respective filter unit 30 in both positions A, B. It is also conceivable for both beam path geometries to be parallel or divergent.

In all applications the spectral transmission curve of the filter unit 30 would be measured very accurately once, such that its optical effect in the measurement set-up would be known sufficiently well.

Figure 16:
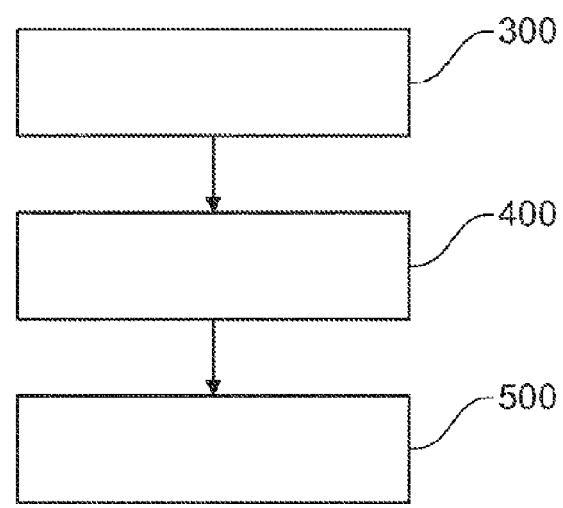
FIG. 16 shows a basic illustration of a sequence of one embodiment of the method according to the invention.

FIG. 16 shows a basic flow diagram of one embodiment of the method according to the invention:

In a step 300, a wavelength-variable test radiation is applied to the EUV optical system 200 to be tested, the wavelengths of said test radiation being substantially of an order of magnitude of an operative radiation of the EUV optical system 200.

In a further step 400, the test radiation is detected downstream of the EUV optical system 200 with a sensor unit.

In a further step 500, the detected test radiation is evaluated by an evaluation unit.

To summarize, the present invention proposes a testing device and a method for improved qualification of EUV optical systems. On account of the fact that the EUV optical system to be tested is qualified here substantially with wavelengths at which it is also operated later in real operation, a very realistic test scenario may advantageously be realized, but without having to simulate the use conditions exactly.

Targeted adaptations of the test spectrum advantageously make it possible to take account of expected production faults of the EUV optical system already in advance, such that a manufacturing process for the EUV optical system is quality assured at an early stage. Advantageously, using the device according to the invention, it is not absolutely necessary to change mechanical parameters of the test set-up during testing, as a result of which a precision and a reproducibility of test results are advantageously increased.

Advantageously, the testing device according to the invention makes it possible also to qualify individual components and/or individual modules of EUV optical systems prior to assembly with wavelengths which are also used in later real operation of the complete EUV optical system. In this way, it is advantageously not necessary to completely assemble the EUV optical system for testing. As a result, an increase in the speed of test sequences may advantageously be achieved.

It is advantageously also conceivable to combine the variants described here with one another in any desired manner, such that the invention also encompasses embodiments which are not described or are only partly described above.

The person skilled in the art will therefore suitably modify the described features or combine them with one another, without departing from the essence of the invention.

What is claimed is:

1. A testing device for an extreme ultraviolet (EUV) optical system, comprising:
a generating unit configured to generate wavelength-variable radiation providing test spectra to the EUV optical system,
wherein the generating unit comprises a filter unit comprising two mirrors arranged opposing each other, wherein the filter unit has at least one entrance opening for entrance radiation of the wavelength-variable radiation, wherein the filter unit is configured to reflect beams of the entrance radiation multiple times between the mirrors, and wherein the filter unit has at least one exit opening through which exit radiation of the reflected beams emerges, and
a sensor unit configured to detect the test spectra following interaction with the EUV optical system,
wherein a target spectrum (Z) of the wavelength-variable radiation generated by the generating unit has at least two generated different, superimposed base spectra (B1, B2).

2. The testing device as claimed in claim 1, wherein the generating unit comprises a plasma source, and wherein the plasma source comprises at least one gas which emits in an operative wavelength range of the EUV optical system.

3. The testing device as claimed in claim 2, wherein the at least one gas comprises a gas selected from the group consisting of argon, krypton, xenon, nitrogen, neon and oxygen.

4. The testing device as claimed in claim 2, wherein the plasma source comprises at least two gases and is configured to vary a mixture ratio of the gases.

5. The testing device as claimed in claim 4, wherein the target spectrum (Z) is defined by a mathematical function having three parameters, wherein the parameters comprise a maximum value, a width and a central wavelength of the target spectrum (Z).

6. The testing device as claimed in claim 1, wherein the target spectrum (Z) is determined through sequential application of the base spectra (B1, B2) to the EUV optical system.

7. The testing device as claimed in claim 1, wherein the generating unit is configured to set a test spectrum through: variation of a distance between the entrance opening and the exit opening and/or through variation of a plate distance between the mirrors.

8. The testing device as claimed in claim 1, wherein the generating unit is configured to set a parallelism between the two mirrors.

9. The testing device as claimed in claim 1, wherein the filter unit has plural entrance openings on a first side and has plural exit openings on a second side, and wherein the entrance openings and the exit openings are each arranged in respective grids, and wherein distances between the entrance openings and the exit openings are respectively set in accordance with a coordinate alignment.

10. The testing device as claimed in claim 1, wherein at least one of a position or an orientation of the filter unit is configured to adjust within the generating unit.

11. The testing device as claimed in claim 1, wherein the filter unit is arranged upstream and/or downstream of the EUV optical system.

12. A method for testing an extreme ultraviolet (EUV) optical system, comprising:
   generating a wavelength-variable test radiation by reflecting beams of radiation multiple times between two mirrors and providing an exit opening for a portion of the reflected beams, to produce test spectra,
   applying the wavelength-variable test radiation to the EUV optical system;
   detecting the test radiation downstream of the EUV optical system with a sensor unit; and
   evaluating the detected test radiation with an evaluation unit.

13. A computer program product comprising a non-transitory computer-readable medium comprising program code configured to perform the method as claimed in claim 12 when executed on an electronic control unit.

14. A computer program product stored on a non-transitory computer-readable data carrier and comprising program code configured to perform the method as claimed in claim 12 when executed on an electronic control unit.

15. A testing device for an extreme ultraviolet (EUV) optical system, comprising:
   a generating unit configured to generate wavelength-variable radiation to provide test spectra to the EUV optical system, and
   a sensor unit configured to detect the test spectra generated by the EUV optical system,
   wherein a target spectrum (Z) generated by the generating unit has at least two generated different, superimposed base spectra (B1, B2), and
   wherein the target spectrum (Z) is determined through sequential application of the base spectra (B1, B2) to the EUV optical system.

* * * * *

UNITED STATES PATENT AND TRADEMARK OFFICE
CERTIFICATE OF CORRECTION

PATENT NO. : 9,857,269 B2
APPLICATION NO. : 15/179252
DATED : January 2, 2018
INVENTOR(S) : Alexander Huebel et al.

Page 1 of 1

It is certified that error appears in the above-identified patent and that said Letters Patent is hereby corrected as shown below:

Column 5, Lines 33-34, Delete "$dS=\lambda max/2=\cos \phi$" and insert -- $dS=\lambda max/2 \times \cos\phi$ --, therefor.

Signed and Sealed this
Twenty-fifth Day of June, 2019

Andrei Iancu
*Director of the United States Patent and Trademark Office*